United States Patent
Lee et al.

(10) Patent No.: US 12,404,361 B2
(45) Date of Patent: Sep. 2, 2025

(54) AMINE-BASED CURING AGENTS, AND COMPOSITIONS, SEMICONDUCTOR PACKAGES, AND ELECTRONIC DEVICES INCLUDING THE SAME

(71) Applicant: SAMSUNG ELECTRONICS CO., LTD., Suwon-si (KR)

(72) Inventors: Insu Lee, Suwon-si (KR); In Kim, Suwon-si (KR); Kyeon Pang, Suwon-si (KR); Byung Hwa Seo, Suwon-si (KR); Mooho Lee, Suwon-si (KR); Changho Noh, Suwon-si (KR); Da-Hye Park, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 409 days.

(21) Appl. No.: 17/935,886

(22) Filed: Sep. 27, 2022

(65) Prior Publication Data
US 2023/0104237 A1    Apr. 6, 2023

(30) Foreign Application Priority Data

Sep. 28, 2021   (KR) .................. 10-2021-0127925

(51) Int. Cl.
*H01L 23/29*   (2006.01)
*C08F 283/10*  (2006.01)

(52) U.S. Cl.
CPC .......... *C08F 283/10* (2013.01); *H01L 23/295* (2013.01)

(58) Field of Classification Search
CPC ......... C08F 283/10; H01L 2225/06541; H01L 2225/06513
See application file for complete search history.

(56) References Cited

U.S. PATENT DOCUMENTS

| | | | |
|---|---|---|---|
| 11,091,625 B2 * | 8/2021 | Park | C08L 51/04 |
| 11,421,073 B2 | 8/2022 | Won et al. | |
| 2014/0205832 A1 * | 7/2014 | Jeong | C08K 5/11 |
| | | | 523/400 |
| 2023/0097638 A1 * | 3/2023 | Hirotaki | C08G 59/1466 |
| | | | 528/97 |

(Continued)

FOREIGN PATENT DOCUMENTS

| | | |
|---|---|---|
| JP | 2007262195 A | 10/2007 |
| JP | 5224366 B2 | 7/2013 |

(Continued)

*Primary Examiner* — Thao P Le
(74) *Attorney, Agent, or Firm* — CANTOR COLBURN LLP

(57) ABSTRACT

An amine-based curing agent including a compound represented by Chemical Formula 1, and a composition including the curing agent, and a semiconductor package, and an electronic device prepared with the composition.

Chemical Formula 1

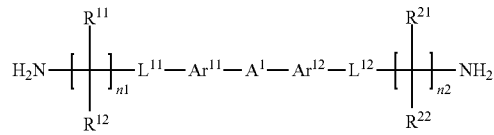

The definition of Chemical Formula 1 is as described in the detailed description.

23 Claims, 5 Drawing Sheets

(56) References Cited

U.S. PATENT DOCUMENTS

| | | | |
|---|---|---|---|
| 2023/0303776 A1* | 9/2023 | Gianneschi | C08L 85/02 |
| 2024/0101523 A1* | 3/2024 | Utaka | C08K 5/357 |
| 2024/0298535 A1* | 9/2024 | Kim | G06V 10/143 |

FOREIGN PATENT DOCUMENTS

| | | |
|---|---|---|
| JP | 5737028 B2 | 6/2015 |
| JP | 2015163598 A | 9/2015 |
| JP | 6407580 B2 | 10/2018 |
| JP | 6453635 B2 | 1/2019 |
| KR | 100462143 B1 | 4/2005 |
| KR | 100599857 B1 | 7/2006 |
| KR | 1373572 B1 | 3/2014 |
| KR | 20210058453 A | 5/2021 |

\* cited by examiner

AMINE-BASED CURING AGENTS, AND COMPOSITIONS, SEMICONDUCTOR PACKAGES, AND ELECTRONIC DEVICES INCLUDING THE SAME

CROSS-REFERENCE TO RELATED APPLICATION

This application claims priority to Korean Patent Application No. 10-2021-0127925 filed in the Korean Intellectual Property Office on Sep. 28, 2021, and all the benefits accruing therefrom under 35 U.S.C. § 119, the entire content of which is herein incorporated by reference.

BACKGROUND

1. Field

Amine-based curing agents and compositions including the curing agents, and semiconductor packages prepared with the compositions, and electronic devices prepared with the packages are disclosed.

2. Description of the Related Art

As semiconductors become lighter, thinner, and smaller in size with the continuing development of electronic devices, semiconductor circuits become more complex with ever increasing circuit density. As a result of this trend to smaller size and greater density, electrical, thermal, and mechanical stability of a molding material becomes a more important factor, e.g., for device stability (reliability) and/or performance. In particular, heat generation is a problem often present in an application processor (AP) of mobile products and the heat may have a significant impact on performance and reliability of the mobile products.

Molding is a process of sealing semiconductors by using a molding composition, which includes a method of making a semiconductor package to protect a semiconductor chip from external environment, e.g., oxygen or moisture as well as other contaminants, to electrically insulate the semiconductor chip, and to effectively dissipate heat during operation of the chip. In particular, a molding protects the semiconductor chip that include wire bonding or flip chip bonding from electrical deterioration by various causes such as corrosion in air, moisture and the like, and to effectively dissipate heat generated during operation, and also provide sufficient mechanical stability to the chip.

In general, the semiconductor package uses an epoxy molding compound or composition (EMC), which is a thermosetting resin, as a molding material. However, present EMCs have limitations in terms of coefficient of thermal expansion (CTE), warpage, and thermal conductivity, and in order to overcome the limitations, excessive amounts of high thermal conductivity inorganic filler may be used in the EMC. However, even though thermal conductivity of the high thermal conductivity inorganic filler may be about 100 Watts per meter per Kelvin (W/mK), and the use of increasing amounts of filler may be an option, there is a limitation in increasing thermal conductivity of a composite material (cured product) in this manner. For instance, if the inorganic filler in the epoxy molding compound (EMC) is present in an amount of about 90% by weight or more, thermal conductivity of a final molding does not exceed about 5 W/mK. In addition, as the loading amount of the filler is increased, mechanical properties are known to deteriorate or degrade. Accordingly, there is interest and a need for a molding composition that exhibit high thermal conductivity after curing with relatively reduced or smaller amounts of the inorganic filler. Accordingly, the development of a molding material for a semiconductor package having high thermal conductivity that can be applied to various electronic devices, or to electrical circuit applications with good heat dissipation properties is of great interest.

SUMMARY

An embodiment provides an amine-based curing agent capable of improving the thermal conductivity of a cured epoxy resin product.

Other embodiments provide a composition, a semiconductor package, and an electronic device including the amine-based curing agent.

According to an embodiment, an amine-based curing agent includes a compound represented by Chemical Formula 1.

Chemical Formula 1

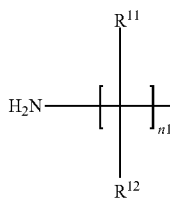 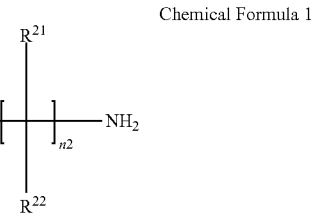

In Chemical Formula 1,
each $R^{11}$, $R^{12}$, $R^{21}$, and $R^{22}$ are independently hydrogen, a halogen, a C1 to C20 alkyl group, a C1 to C20 heteroalkyl group, a C1 to C20 haloalkyl group, a C1 to C20 alkoxy group, or a C6 to C10 aryl group,
$A^1$ is $-CR^a=CR^b-$, $-N=CR^c-$, $-N=N-$, or $-CR^d=N-$, wherein $R^a$, $R^b$, $R^c$, and $R^d$ are each independently hydrogen, a C1 to C10 alkyl group, or a C1 to C10 haloalkyl group,
$L^{11}$ and $L^{12}$ are each independently $-C(=O)O-$, $-OC(=O)-$, $-O-C(=O)O-$, $-C(=O)-$, $-CR^e=CR^f-C(=O)-$, $-S(=O)-$, $-CR^g=N-$, $-NR^hC(=O)O-$, $-C(=O)NR^{hi}-$, or $-OC(=O)NHS(=O)O-$, wherein $R^e$, $R^f$, $R^g$, $R^h$, and $R^i$ are each independently hydrogen, a C1 to C10 alkyl group, or a C1 to C10 haloalkyl group,
$Ar^{11}$ and $Ar^{12}$ are each independently a substituted or unsubstituted C6 to C30 arylene group, C2 to C30 heteroarylene group, or a combination thereof, and
n1 and n2 are each independently an integer of greater than or equal to 2.

In Chemical Formula 1 $Ar^{11}$ and $Ar^{12}$ may each independently be selected moieties represented by Chemical Formulas 1A to 1I.

Chemical Formulas 1A to 1I

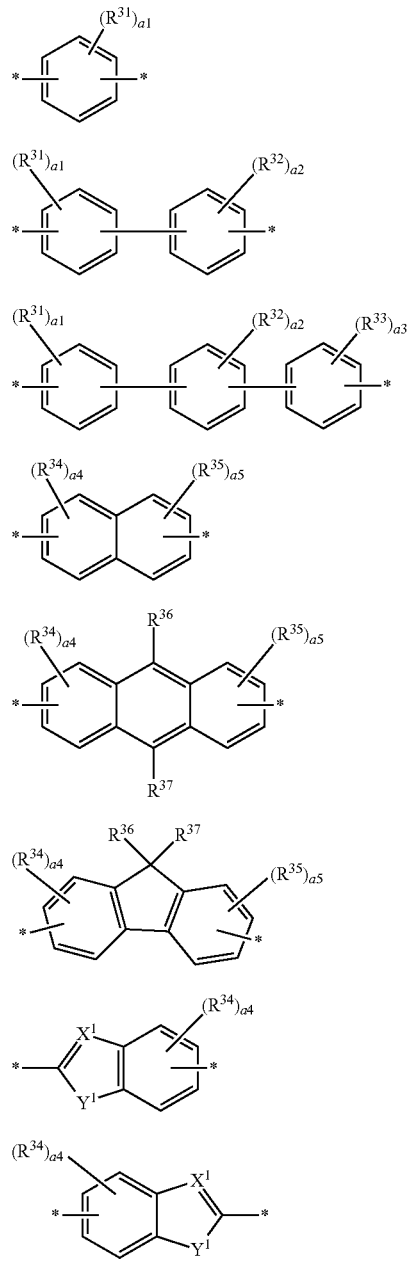

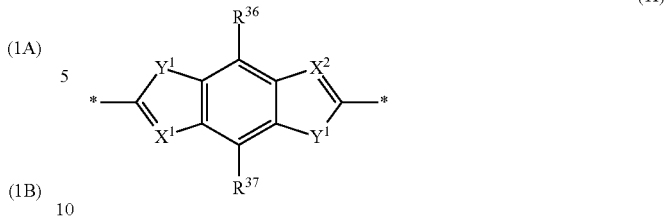

In Chemical Formulas 1A to 1I,
each $R^{31}$, $R^{32}$, $R^{33}$, $R^{34}$, $R^{35}$, $R^{36}$, and $R^{37}$ are independently hydrogen or a C1 to C10 alkyl group,
$X^1$ and $X^2$ are each independently $CR^x$, N, P, or As, wherein $R^x$ is hydrogen, a C1 to C10 alkyl group, or a C1 to C10 haloalkyl group,
$Y^1$ and $Y^2$ are each independently O, S, Se, or Te,
a1, a2 and a3 are each independently an integer of 0 to 4,
a4 and a5 are each independently an integer of 0 to 3, and
* is a linking point.

In Chemical Formula 1 $Ar^{11}$ and $Ar^{12}$ may be the same or different aromatic moieties.

In Chemical Formula 1, an $L^{11}$-$Ar^{11}$ bond and an $Ar^{11}$-$A^1$ bond may be in a meta position or a para position to each other, and independently, an $L^{12}$-$Ar^{12}$ bond and an $Ar^{12}$-$A^1$ bond may be in a meta position or a para position to each other.

The compound represented by Chemical Formula 1 may include a compound represented by Chemical Formula 2.

Chemical Formula 2

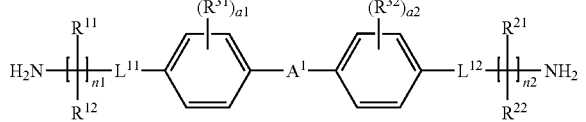

In Chemical Formula 2,
$R^{11}$, $R^{12}$, $R^{21}$, $R^{22}$, $A^1$, $L^{11}$, $L^{12}$, n1, and n2 are the same as in Chemical Formula 1,
each $R^{31}$ and $R^{32}$ are independently hydrogen, a C1 to C10 alkyl group, a C1 to C10 haloalkyl group, or a C6 to C10 aryl group, and
a1 and a2 are each independently an integer of 0 to 4.

The compound represented by Chemical Formula 1 may include a compound represented by Chemical Formula 3.

Chemical Formula 3

Chemical Formula 2

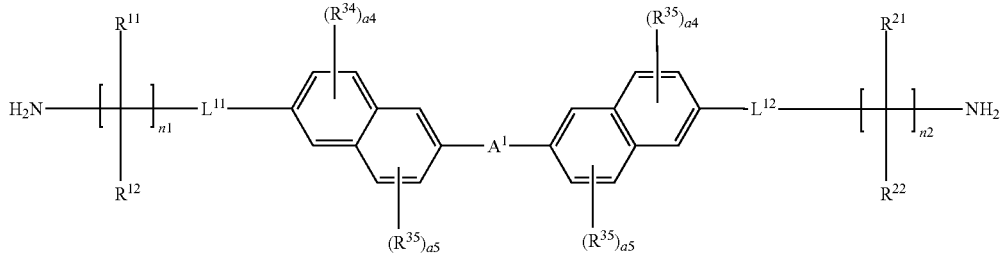

In Chemical Formula 3,
$R^{11}$, $R^{12}$, $R^{21}$, $R^{22}$, $A^1$, $L^{11}$, $L^{12}$, n1, and n2 are the same as in Chemical Formula 1,
each $R^{34}$, $R^{35}$, $R^{\prime 34}$, and $R^{\prime 35}$ are independently hydrogen, a C1 to C10 alkyl group, a C1 to C10 haloalkyl group, or a C6 to C10 aryl group, and
a4, a5, a4' and a5' are each independently an integer of 0 to 3.

In Chemical Formula 1, n may be in the range of 2 to 12.

Another embodiment provides a composition including the amine-based curing agent and an epoxy compound.

The epoxy compound may be a compound represented by Chemical Formula 4.

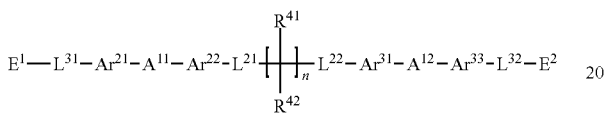

Chemical Formula 4

In Chemical Formula 4,
each $R^{41}$ and $R^{42}$ are independently hydrogen, a halogen, a C1 to C20 alkyl group, a C1 to C20 heteroalkyl group, a C1 to C20 haloalkyl group, a C1 to C20 alkoxy group, or a C6 to C10 aryl group,
$A^{11}$ and $A^{12}$ are —$CR^a$=$CR^b$—, —N=$CR^c$—, —N=N—, or —$CR^d$=N—, wherein $R^a$, $R^b$, $R^c$ and $R^d$ are each independently hydrogen, a C1 to C10 alkyl group, or a C1 to C10 haloalkyl group,
$L^{21}$, $L^{22}$, $L^{31}$, and $L^{32}$ are each independently —C(=O)O—, —OC(=O)—, —O—C(=O)O—, —C(=O)—, —$CR^e$=$CR^f$—C(=O)—, —S(=O)—, —$CR^g$=N—, —$NR^h$C(=O)O—, —C(=O)$NR^{hi}$—, or —OC(=O)NHS(=O)O—, wherein $R^e$, $R^f$, $R^g$, $R^h$, and $R^i$ are each independently hydrogen, a C1 to C10 alkyl group, or a C1 to C10 haloalkyl group,
$Ar^{21}$, $Ar^{22}$, $Ar^{31}$, and $Ar^{32}$ are each independently a substituted or unsubstituted C6 to C30 arylene group, a substituted or unsubstituted $C_2$ to C30 heteroarylene group, or a combination thereof,
$E^1$ and $E^2$ are each independently an epoxy-containing group, and
n is an integer of greater than or equal to 2.

In Chemical Formula 4, $Ar^{21}$, $Ar^{22}$, $Ar^{31}$, and $Ar^{32}$ may be each independently selected from the moieties represented by Chemical Formulas 1A to 1I as described above.

In Chemical Formula 4, an $L^{31}$-$Ar^{21}$ bond and an $Ar^{21}$-$A^{11}$ bond; an $A^{11}$-$Ar^{22}$ bond and an $Ar^{22}$-$L^{21}$ bond; an $L^{22}$-$Ar^{31}$ bond and an $Ar^{31}$-$A^{12}$ bond; and an $A^{12}$-$Ar^{33}$ bond and an $Ar^{33}$-$L^{32}$ bond may be each independently in a meta position or a para position to each other.

In Chemical Formula 4, and $Ar^{22}$ and $Ar^{31}$ and $Ar^{32}$ may be the same as or different.

In Chemical Formula 4, $Ar^{21}$, $Ar^{22}$, $Ar^{31}$, and $Ar^{32}$ may be substituted or unsubstituted phenylene.

In Chemical Formula 4, $Ar^{21}$, $Ar^{22}$, $Ar^{31}$, and $Ar^{32}$ may be a substituted or an unsubstituted naphthalene.

In Chemical Formula 4, $Ar^{21}$ and $Ar^{22}$ may be independently a substituted or an unsubstituted phenylene, $Ar^{31}$ and $Ar^{32}$ may be a substituted or an unsubstituted naphthalene, $Ar^{21}$ and $Ar^{22}$ may be a substituted or an unsubstituted naphthalene, and $Ar^{31}$ and $Ar^{32}$ may be a substituted or an unsubstituted phenylene.

The epoxy-containing groups of Chemical Formula 4, $E^1$ and $E^2$, may be independently represented by Chemical Formula 6.

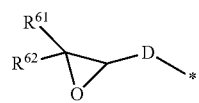

Chemical Formula 6

In Chemical Formula 6,
D is —O—, —$(CR^pR^q)_m$—, —$(CH(R^p)CH(R^q)O)_l$—, or a combination thereof,
$R^{61}$ and $R^{62}$ are each independently hydrogen, a halogen, a C1 to C10 alkyl group, or a C1 to C10 haloalkyl group,
each $R^p$ and $R^q$ are each independently hydrogen, a halogen, a C1 to C10 alkyl group, or a C1 to C10 haloalkyl group,
m is an integer from 1 to 10, and
l is an integer from 1 to 10.

—$CR^pR^q$— of Chemical Formula 6 may be replaced by oxygen (—O—).

The epoxy-containing groups, $E^1$ and $E^2$, of Chemical Formula 4 may be independently represented by Chemical Formulas 6A to 6H.

Chemical Formulas 6A to 6H

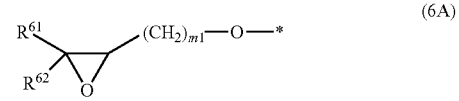

(6A)

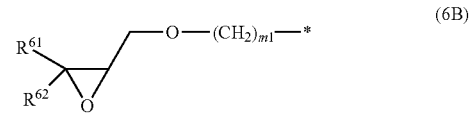

(6B)

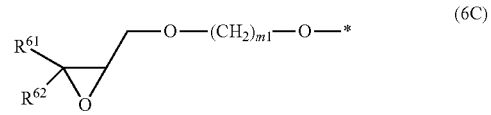

(6C)

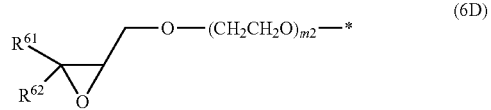

(6D)

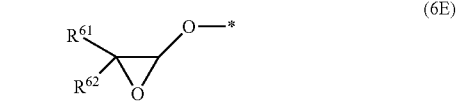

(6E)

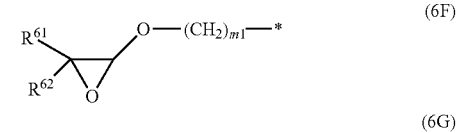

(6F)

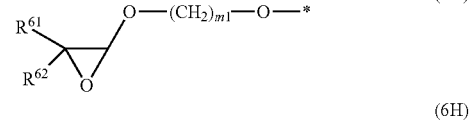

(6G)

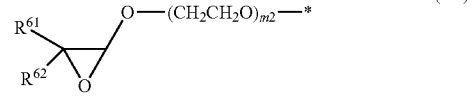

(6H)

In Chemical Formulas 6A to 6H, $R^{61}$ and $R^{62}$ are each independently hydrogen, a halogen, a C1 to C10 alkyl group, or a C1 to C10 haloalkyl group, $R^p$ and $R^q$ are each independently hydrogen, a halogen, a C1 to C10 alkyl group, or a C1 to C10 haloalkyl group, and m1 and m2 are each independently an integer of 1 to 10.

The composition may further include a bisphenol epoxy resin, a novolac epoxy resin, a biphenyl epoxy resin, an aryl alkylene epoxy resin, a naphthalene epoxy resin, an anthracene epoxy resin, a phenoxy epoxy resin, a dicyclopentadiene epoxy resin, a norbornene-epoxy resin, an adamantane epoxy resin, a fluorene epoxy resin, or a combination thereof.

The composition may further include a filler.

According to another embodiment, a semiconductor package including a cured product produced from the composition is provided.

The semiconductor package includes
a substrate,
at least one chip mounted on the substrate;
a connection portion for electrically connecting the at least one chip and the substrate,
a molding portion encapsulating the at least one chip on the substrate,
wherein the molding portion includes a cured product produced by using the composition.

According to another embodiment, an electronic device including a cured product produced from the composition is provided.

The amine-based curing agent and the composition including the curing agent may provide high thermal conductivity, and therefore, exhibit high heat dissipation properties with relatively reduced content of inorganic filler in the composition, and yet, still provide high thermal conductivity and/or device stability. The amine-based curing agent and the composition including the curing agent may be developed as a molding material having high thermal conductivity for a semiconductor package, and applied to various electronic devices, or to electrical circuit applications, with the necessary heat dissipation properties as required.

DETAILED DESCRIPTION

Figure 1:
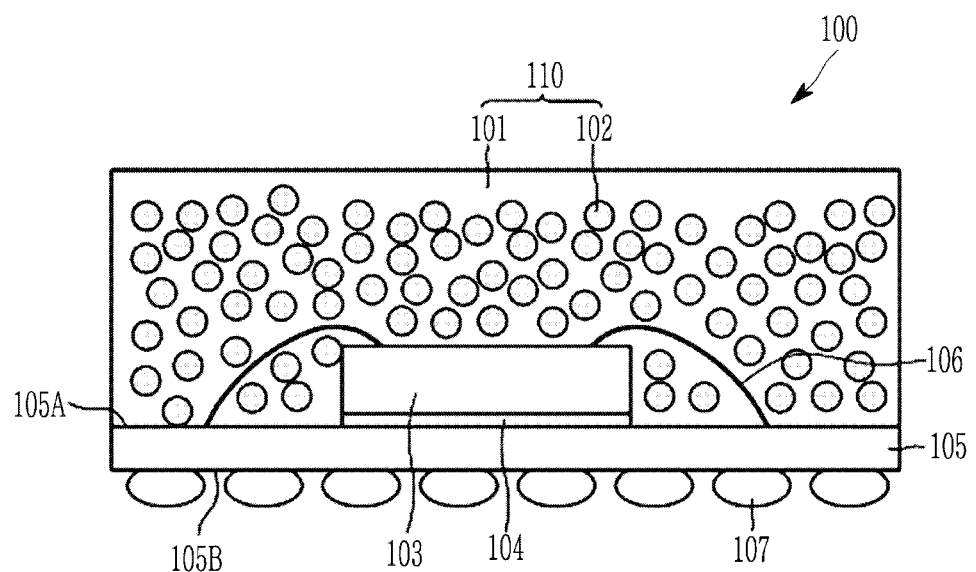
FIG. 1 is a cross-sectional schematic representation of a semiconductor package according to an embodiment.

Advantages and characteristics of this disclosure, and a method for achieving the same, will become evident referring to the following example embodiments together with the drawings. The invention, however, is not limited to the embodiments disclosed, and may be embodied or implemented in many different forms different, and therefore, should not be construed as limited to the embodiments set forth herein. Like reference numerals refer to like elements throughout. The present embodiments are provided to complete the present disclosure, and to fully inform the scope of the invention to those skilled in the art to which the present invention pertains, and the invention is only defined by the scope of the claims.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

The terminology used herein is for the purpose of describing particular embodiments only and is not intended to be limiting. As used herein, the singular forms "a," "an," and "the" are intended to include the plural forms, unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element such as a layer, film, region, or substrate is referred to as being "on" another element, it may be directly on the other element or intervening elements may also be present. In contrast, when an element is referred to as being "directly on" another element, there are no intervening elements present.

As used herein, "at least one of A, B, or C," "one of A, B, C, or a combination thereof" and "one of A, B, C, and a combination thereof" refer to each constituent element, and a combination thereof (e.g., A; B; C; A and B; A and C; B and C; or A, B and C).

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or ±5% of the stated value.

As used herein, when a definition is not otherwise provided, "substituted" refers to replacement of hydrogen of a compound or a functional group by a substituent selected from a halogen atom, a hydroxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a silyl group, a C1 to C20 alkyl group, a C1 to C20 alkoxy group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroaryl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, or a combination thereof. Moreover, the carbon atoms provided by the substituent, if present, is exclusive of the stated carbon atoms in the hydrocarbon groups that follow or recited in the claims.

Unless otherwise defined, "halogen" means F, Cl, Br, or I, and "haloalkyl group" is one in which at least one hydrogen of an alkyl group is substituted with a halogen (e.g., $CCF_3$, $CHCF_2$, $CH_2F$, $CCl_3$, etc.). Non-limiting examples of "haloalkyl group" include polyhaloalkyl groups such as monohaloalkyl groups, dihaloalkyl groups, or perhaloalkyl groups. The monohaloalkyl group is an alkyl group substituted with one iodine, bromine, chlorine, or fluorine is contained in the alkyl group, and the dihaloalkyl group and the polyhaloalkyl group mean an alkyl group substituted with two or more identical or different halogen atoms.

Unless otherwise defined, "hetero" means containing 1 to 4 heteroatoms selected from one or more of N, O, S, Se, Te, Si, and P.

Unless otherwise defined, "alkyl group" refers to a fully saturated (straight or branched chain), substituted or unsubstituted hydrocarbon group. Preferred alkyl groups are those containing from one to twenty carbon atoms. Non-limiting examples of the "alkyl group" may include a substituted or unsubstituted methyl group, an ethyl group, an n-propyl group, an isopropyl group, an n-butyl group, an isobutyl group, a sec-butyl group, an n-pentyl group, an isopentyl group, a neopentyl group, an iso-amyl group, an n-hexyl group, a 3-methylhexyl group, a 2,2-dimethylpentyl group, a 2,3-dimethylpentyl group, an n-heptyl group, and the like.

Unless otherwise defined, "heteroalkyl group" refer to an alkyl group in which at least one (—$CH_2$—) is replaced by an oxygen, sulfur, a carbonyl moiety, an ester moiety, —NH—, or a combination thereof.

Unless otherwise defined below, "alkoxy group" represents alkyl-O—, and the alkyl is the same as described above. Non-limiting examples of the alkoxy group may include a substituted or unsubstituted methoxy group, an ethoxy group, a propoxy group, a 2-propoxy group, a butoxy group, a tert-butoxy group, a pentyloxy group, a hexyloxy group, and the like.

The term "aryl" refers to and includes both single-ring aromatic hydrocarbyl groups and polycyclic aromatic ring systems. The polycyclic rings may have two or more rings in which two carbons are common to two adjoining rings (the rings are "fused") wherein at least one of the rings is an aromatic hydrocarbyl group, e.g., the other rings can be cycloalkyls, cycloalkenyls, aryls, heterocycles, and/or heteroaryls. Preferred aryl groups are those containing six to fourteen carbon atoms, preferably six to ten carbon atoms. Especially preferred is an aryl group having six carbons or ten carbons. Exemplary aryl groups include, but not limited to phenyl, biphenyl, triphenyl, triphenylene, naphthalene, anthracene, phenalene, phenanthrene, preferably phenyl, biphenyl, triphenyl, triphenylene, and naphthalene. Additionally, the aryl group may be optionally substituted.

Unless otherwise defined, "arylene group" is used alone or in combination to be a divalent aromatic hydrocarbon group including one or more rings. Preferred arylene groups are those containing six to thirty carbon atoms, preferably six to twenty carbon atoms. The "arylene group" includes groups in which an aromatic ring is fused to one or more rings, including cycloalkyl, cycloalkenyl, aryl, heterocycle, and/or heteroaryl. Non-limiting examples of the "arylene group" include a phenylene group, a naphthalene group, a tetrahydronaphthalene group, and the like.

Unless otherwise defined, a "heteroarylene" group refers to a monocyclic or bicyclic organic group in which at least one heteroatom selected from N, O, P, or S is present as a ring atom and the remaining ring atoms are carbon. The heteroaryl group may include, for example, 1 to 5 ring heteroatoms, and 3 to 22 ring carbons.

The heteroarylene group may include two to thirty ring carbons.

Exemplary heteroarylene group may include, but not limited to, a thienylene group, a pyrrolylene group, an imidazolylene group, a pyrazolylene group, a thiazolylene group, an isothiazolylene group, a 1,2,3-oxadiazolylene group, 1,2,4-oxadiazolylene group, a 1,2,5-oxadiazolylene group, a 1,3,4-oxadiazolylene group, a 1,2,3-thiadiazolylene group, a 1,2,4-thiadiazolylene group, a 1,2,5-thiadiazolylene group, a 1,3,4-thiadiazolylene group, an isothiazol-3-ylene group, isothiazol-4-ylene group, an isothiazol-5-ylene group, an oxazol-2-ylene group, an oxazol-4-ylene group, an oxazol-5-ylene group, an isoxazol-3-ylene group, an isoxazol-4-ylene group, an isoxazol-5-ylene group, a 1,2,4-triazol-3-ylene group, a 1,2,4-triazol-5-ylene group, a 1,2,3-triazol-4-ylene group, a 1,2,3-triazole-5-ylene group, a tetrazolyl group, a pyrid-2-ylene group, a pyrid-3-ylene group, a 2-pyrazin-2-ylene group, a pyrazin-4-ylene group, a pyrazin-5-ylene group, a 2-pyrimidin-2-ylene group, a 4-pyrimidin-2-ylene group, or a 5-pyrimidin-2-ylene group.

Examples of the bicyclic heteroarylene group may include an indolylene group, an isoindolylene group, an indazolylene group, an indolizinylene group, a purinylene group, a quinolizinylene group, a quinolinylene group, an isoquinolinylene group, a cinnolinylene group, a phthalazinyiene group, s naphthyridinylene group, a quinazolinylene group, a quinaxalinylene group, a phenanthridinylene group, a phenathrolinylene group, a phenazinylene group, a phenothiazinylene group, a phenoxazinylene group, a benzoisoquinolinylene group, a thieno[2,3-b]furanylene group, a furo[3,2-b]-pyranylene group, a 5H-pyrido[2,3-d]-o-oxazinylene group, a 1H-pyrazolo[4,3-d]-oxazolylene group, 4H-imidazo[4,5-d]thiazolylene group, a pyrazino[2,3-d]pyridazinylene group, an imidazo[2,1-b]thiazolylene group, an imidazo[1,2-b][1,2,4]triazinylene group, a 7-benzo[b]thienylene group, a benzoxazolylene group, a benzimidazolylene group, a benzoxazepinylene group, a benzoxazinylene group, a 1H-pyrrolo[1,2-b][2]benzazapinylene group, a benzofurylene group, a benzothiophenylene group, a benzotriazolylene group, a pyrrolo[2,3-b]pyridinylene group, a pyrrolo [3,2-c]pyridinylene group, a pyrrolo[3,2-b]pyridinylene group, an imidazo [4,5-b]pyridinylene group, an imidazo [4,5-c]pyridinylene group, a pyrazolo[4,3-d]pyridinylene group, a pyrazolo[4,3-c]pyridinylene group, a pyrazolo [3,4-c]pyridinylene group, a pyrazolo [3,4-d]pyridinylene group, a pyrazolo[3,4-b]pyridinylene group, an imidazo[1,2-a]pyridinylene group, a pyrazolo[1,5-a]pyridinylene group, a pyrrolo [1,2-b]pyridazinylene group, an imidazo[1,2-c]pyrimidinylene group, a pyrido[3, 2-d]pyrimidinylene group, a pyrido[4,3-d]pyrimidinylene group, a pyrido [3,4-d]pyrimidinylene group, a pyrido[2,3-d]pyrimidinylene group, a pyrido[2,3-b]pyrazinylene group, a pyrido[3,4-b]pyrazinylene group, a pyrimido[5,4-d]pyrimidinylene group, a pyrazino [2,3-b]pyrazinylene group, or a pyrimido[4,5-d]pyrimidinylene group.

Hereinafter, an amine-based curing agent according to an embodiment and a composition including the amine-based curing agent (e.g., a molding composition for a semiconductor package) will be described in more detail.

In general, even if the thermal conductivity of the inorganic filler is as high as about 100 Watts per meter per Kelvin (W/mK) and is used in a molding composition it is near-impossible to achieve a thermal conductivity of the final cured molding product to about 5 W/mK or more.

A polymer material is generally known as a thermal insulator and has a bulk thermal conductivity of about 0.2 W/mK, and a thermosetting polymer that can be used as a material for a semiconductor package has a thermal conductivity of about 0.1 to about 0.2 W/mK.

In a polymer that is an insulator, heat transfer is achieved by vibration transfer of phonons, and thus a polymer design that maximizes the path of phonons by minimizing scattering of phonons is required.

Therefore, in an embodiment, a mesogen unit capable of π-conjugation is introduced to the amine-based curing agent participating in the formation of the polymer, and this mesogen unit forms a domain by π-conjugation. Therefore, it is possible to improve the thermal conductivity by securing a path for phonons. The amine-based curing agent having such a structure is represented by Chemical Formula 1:

flexibility and improve processability. These spacers allow regular alignment of the mesogenic units to form domains having a regular alignment structure.

In Chemical Formula 1, $Ar^{11}$-$A^1$-$Ar^{12}$ is a mesogen unit, and $Ar^{11}$-$A^1$-$Ar^{12}$ including $A^1$ in the mesogen unit forms a domain by π-π stacking to secure a phonon passage.

In Chemical Formula 1, $L^{11}$ and $L^{12}$ are linkers, which can lower a melting temperature compared to an —O— linker and provide flexibility to the final cured product.

In Chemical Formula 1, $Ar^{11}$ and $Ar^{12}$ may be each independently represented by Chemical Formulas 1A to 1I.

Chemical Formulas 1A to 1I

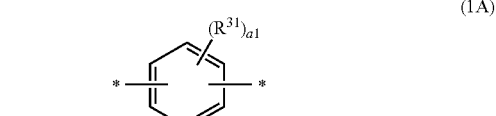
(1A)

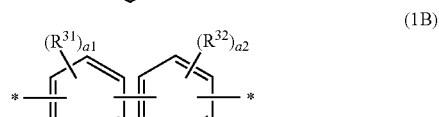
(1B)

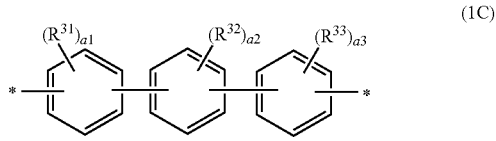
(1C)

Chemical Formula 1

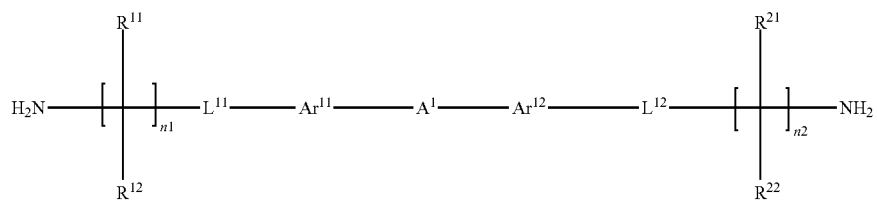

In Chemical Formula 1,
each $R^{11}$, $R^{12}$, $R^{21}$, and $R^{22}$ are independently hydrogen, a halogen, a C1 to C20 alkyl group, a C1 to C20 heteroalkyl group, a C1 to C20 haloalkyl group, a C1 to C20 alkoxy group, or a C6 to C10 aryl group, $A^1$ is —$CR^a$=$CR^b$—, —N=$CR^c$—, —N=N—, or —$CR^d$=N—, wherein $R^a$, $R^b$, $R^c$, and $R^d$ are each independently hydrogen, a C1 to C10 alkyl group, or a C1 to C10 haloalkyl group, $L^{11}$ and $L^{12}$ are each independently —C(=O)O—, —OC(=O)—, —O—C(=O)O—, —C(=O)—, —$CR^e$=$CR^f$—C(=O)—, —S(=O)—, —$CR^g$=N—, —$NR^h$C(=O)O—, —C(=O)$NR^{hi}$—, or —OC(=O)NHS(=O)O—, wherein $R^e$, $R^f$, $R^g$, $R^h$, and $R^i$ are each independently hydrogen, a C1 to C10 alkyl group, or a C1 to C10 haloalkyl group, $Ar^{11}$ and $Ar^{12}$ are each independently a substituted or unsubstituted C6 to C30 arylene group, C2 to C30 heteroarylene group, or a combination thereof, and n1 and n2 are each independently an integer of greater than or equal to 2.

In Chemical Formula 1, —$CR^{11}R^{12}$— and —$CR^{21}R^{22}$— may serve as a spacer in the cured product to provide -continued

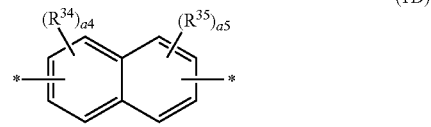
(1D)

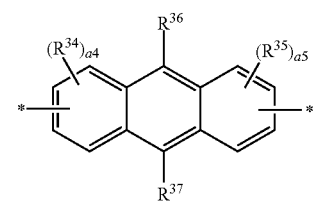
(1E)

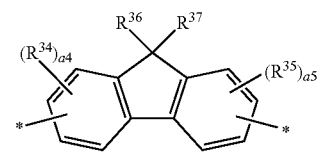
(1F)

-continued

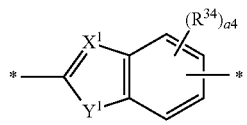
(1G)

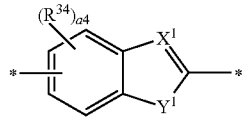
(1H)

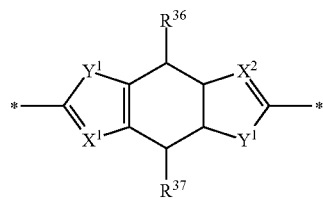
(1I)

In Chemical Formulas 1A to 1I,
each $R^{31}$, $R^{32}$, $R^{33}$, $R^{34}$, $R^{35}$, $R^{31}$, and $R^{37}$ are independently hydrogen or a C1 to C10 alkyl group,
$X^1$ and $X^2$ are each independently $CR^x$, N, P, or As, wherein $R^x$ is hydrogen, a C1 to C10 alkyl group, or a C1 to C10 haloalkyl group,
$Y^1$ and $Y^2$ are each independently O, S, Se, or Te,
a1, a2, and a3 are each independently an integer of 0 to 4,
a4 and a5 are each independently an integer of 0 to 3, and
* is a linking point.

In Chemical Formula 1 $Ar^{11}$ and $Ar^{12}$ may be the same or different aromatic moieties.

In Chemical Formula 1, an $L^{11}$-$Ar^{11}$ bond and an $Ar^{11}$-$A^1$ bond may be in a meta position or a para position to each other, and independently, an $L^{12}$-$Ar^{12}$ bond and an $Ar^{12}$-$A^1$ bond may be in a meta position or a para position to each other.

The compound represented by Chemical Formula 1 may include a compound represented by Chemical Formula 2.

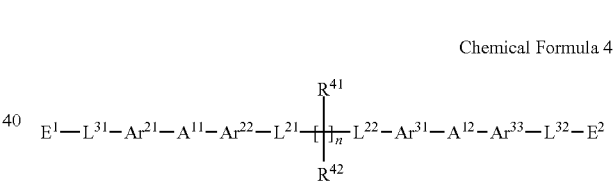

Chemical Formula 2

In Chemical Formula 2,
$R^{11}$, $R^{12}$, $R^{21}$, $R^{22}$, $A^1$, $L^{11}$, $L^{12}$, n1, and n2 are the same as in Chemical Formula 1,
each $R^{31}$ and $R^{32}$ are independently hydrogen, a C1 to C10 alkyl group, a C1 to C10 haloalkyl group, or a C6 to C10 aryl group, and
a1 and a2 are each independently an integer of 0 to 4.

The compound represented by Chemical Formula 1 may include a compound represented by Chemical Formula 3.

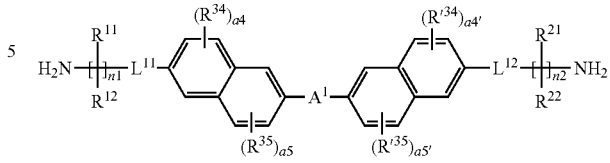

Chemical Formula 3

In Chemical Formula 3,
$R^{11}$, $R^{12}$, $R^{21}$, $R^{22}$, $A^1$, $L^{11}$, $L^{12}$, n1, and n2 are the same as in Chemical Formula 1,
each $R^{34}$, $R^{35}$, $R'^{34}$, and $R'^{35}$ are independently hydrogen, a C1 to C10 alkyl group, a C1 to C10 haloalkyl group, or a C6 to C10 aryl group, and
a4, a5, a4' and a5' are each independently an integer of 0 to 3.

In Chemical Formulas 1, 2, and 3, n may be in the range of 2 or more, 3 or more, 4 or more, or 5 or more, and 12 or less, 11 or less, 10 or less, or 9 or less.

Chemical Formulas 2 and 3 are examples in which $Ar^{11}$ and $Ar^{12}$ are substituted or unsubstituted phenylene or substituted or unsubstituted naphthalene, respectively, and they are bonded in a para position, but the aromatic moieties represented by Chemical Formulas 1A to 1I may be introduced into Chemical Formula 1 in the same manner.

Another embodiment provides a composition including the amine-based curing agent and an epoxy compound. The composition may be a molding composition for a semiconductor package.

The epoxy compound may be a compound represented by Chemical Formula 4.

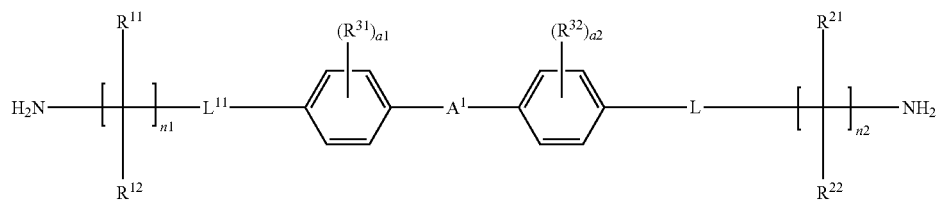

Chemical Formula 4

In Chemical Formula 4,
each $R^{41}$ and $R^{42}$ are independently hydrogen, a halogen, a C1 to C20 alkyl group, a C1 to C20 heteroalkyl group, a C1 to C20 haloalkyl group, a C1 to C20 alkoxy group, or a C6 to C10 aryl group,
$A^{11}$ and $A^{12}$ are —$CR^a$=$CR^b$—, —N=$CR^c$—, —N=N—, or —$CR^d$=N—, wherein $R^a$, $R^b$, $R^c$ and $R^d$ are each independently hydrogen, a C1 to C10 alkyl group, or a C1 to C10 haloalkyl group,
$L^{21}$, $L^{22}$, $L^{31}$, and $L^{32}$ are each independently —C(=O)O—, —OC(=O)—, —O—C(=O)O—, —C(=O)—, —$CR^e$=$CR^f$—C(=O)—, —S(=O)—, —$CR^g$=N—, —NR$^h$C(=O)O—, —C(=O)NR$^{hi}$—, or —OC(=O)NHS(=O)O—, wherein R$^e$, R$^f$, R$^g$, R$^h$, and R$^i$ are each independently hydrogen, a C1 to C10 alkyl group, or a C1 to C10 haloalkyl group, Ar$^{21}$, Ar$^{22}$, Ar$^{31}$, and Ar$^{32}$ are each independently a substituted or unsubstituted C6 to C30 arylene group, a substituted or unsubstituted C$_2$ to C30 heteroarylene group, or a combination thereof, E$^1$ and E$^2$ are each independently an epoxy-containing group, and n is an integer of greater than or equal to 2.

The epoxy compound of Chemical Formula 4 includes a mesogen unit capable of π-conjugation, and this mesogen unit forms a domain by π-conjugation, thereby providing a path for phonon transport and achieving the desired thermal conductivity. When the amine-based curing agent of Chemical Formula 1 and the epoxy compound of Chemical Formula 4 are used together, thermal conductivity may be further improved.

In Chemical Formula 4, —CR$^{41}$R$^{42}$— serves as a spacer in the cured product to provide flexibility and improve processability. These spacers allow regular alignment of the mesogen units to form domains having a regular alignment structure.

In Chemical Formula 4, Ar$^{21}$-A$^{11}$-Ar$^{22}$ and Ar$^{31}$-A$^{12}$-Ar$^{33}$ are mesogenic units, and Ar$^{21}$-A$^{11}$-Ar$^{22}$ including A$^{11}$ in the mesogen unit and Ar$^{31}$-A$^{12}$-Ar$^{33}$ including A$^{12}$ may form a domain by are π-π stacking, and thus may secure a path for phonon transport.

In Chemical Formula 4, L$^{21}$, L$^{22}$, L$^{31}$, and L$^{32}$ are linkers, which may lower a melting temperature compared to the —O— linker and provide flexibility to the final cured product.

In Chemical Formula 4, an L$^{31}$-Ar$^{21}$ bond and an Ar$^{21}$-A$^{11}$ bond; an A$^{11}$-Ar$^{22}$ bond and an Ar$^{22}$-L$^{21}$ bond; an L$^{22}$-Ar$^{31}$ bond and an Ar$^{31}$-A$^{12}$ bond; and an A$^{12}$-Ar$^{33}$ bond and an Ar$^{33}$-L$^{32}$ bond may be independently in a meta position or a para position to each other.

In Chemical Formula 4, Ar$^{21}$ and Ar$^{22}$ and Ar$^{31}$ and Ar$^{32}$ may be the same as or different aromatic moieties.

In Chemical Formula 4, Ar$^{21}$, Ar$^{22}$, Ar$^{31}$, and Ar$^{32}$ may be substituted or unsubstituted phenylene. In this case, the epoxy compound represented by Chemical Formula 4 may be represented by Chemical Formula 5.

in a para position to each other, but the moieties represented by Chemical Formulas 1A to 1I may be introduced into Chemical Formula 1 in the same manner.

For example, in Formula 4, Ar$^{21}$, Ar$^{22}$, Ar$^{31}$, and Ar$^{32}$ may be substituted or unsubstituted naphthalene.

In Chemical Formula 4, Ar$^{21}$ and Ar$^{22}$ may be a substituted or unsubstituted phenylene, Ar$^{31}$ and Ar$^{32}$ may be a substituted or unsubstituted naphthalene, Ar$^{21}$ and Ar$^{22}$ may be a substituted or unsubstituted naphthalene, and Ar$^{31}$ and Ar$^{32}$ may be a substituted or unsubstituted phenylene.

The epoxy-containing group of Chemical Formula 4 may be represented by Chemical Formula 6.

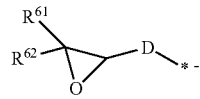

Chemical Formula 6

In Chemical Formula 6,

D is —O—, —(CR$^p$R$^q$)$_m$—, —(CH(R$^p$)CH(R$^q$)O)$_l$—, or a combination thereof, R$^{61}$ and R$^{62}$ are each independently hydrogen, a halogen, a C1 to C10 alkyl group, or a C1 to C10 haloalkyl group, each R$^p$ and R$^q$ are independently hydrogen, a halogen, a C1 to C10 alkyl group, or a C1 to C10 haloalkyl group, m is an integer from 1 to 10, and l is an integer from 1 to 10.

In an embodiment, D of Chemical Formula 6 may be —O—.

The epoxy-containing group of Chemical Formula 4 may be represented by Chemical Formulas 6A to 6H.

Chemical Formulas 6A to 6H

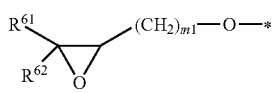

(6A)

Chemical Formula 5

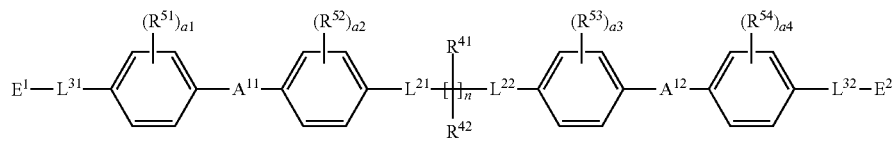

In Chemical Formula 5,

R$^{41}$, R$^{42}$, A$^{11}$, A$^{12}$, L$^{21}$, L$^{22}$, L$^{31}$, L$^{32}$, E$^1$, E$^2$, and n are the same as in Chemical Formula 4, each R$^{51}$, R$^{52}$, R$^{53}$, and R$^{54}$ are independently hydrogen, a C1 to C10 alkyl group, a C1 to C10 haloalkyl group, or a C6 to C10 aryl group, and a1, a2, a3 and a4 are each independently an integer of 0 to 4.

In Chemical Formula 4 and Chemical Formula 5, n may be in the range of 2 or more, 3 or more, 4 or more, or 5 or more, and 12 or less, 11 or less, 10 or less, or 9 or less.

In Chemical Formula 5, Ar$^{21}$, Ar$^{22}$, Ar$^{31}$, and Ar$^{32}$ are substituted or unsubstituted phenylene, and they are bonded -continued

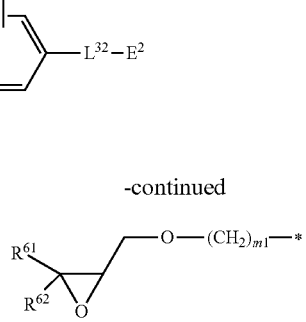

(6B)

(6C)

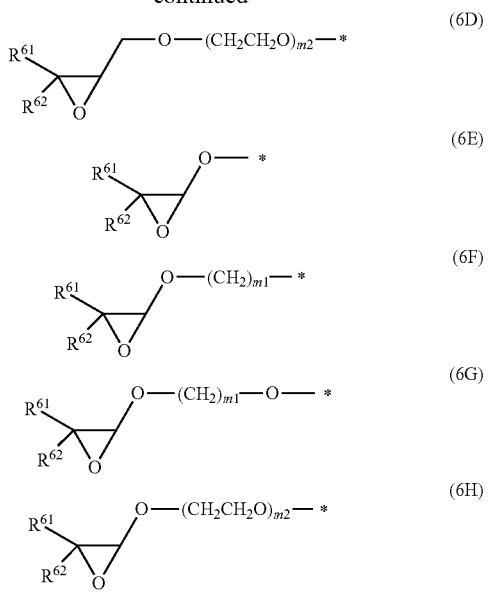

In Chemical Formulas 6A to 6H, $R^{61}$ and $R^{62}$ are each independently hydrogen, a halogen, a C1 to C10 alkyl group, or a C1 to C10 haloalkyl group, $R^p$ and $R^q$ are each independently hydrogen, a halogen, a C1 to C10 alkyl group, or a C1 to C10 haloalkyl group, and m1 and m2 are each independently an integer of 1 to 10.

An amount of the amine-based curing agent in the composition is not particularly limited, but may be greater than or equal to about 0.5 equivalents, greater than or equal to about 0.6 equivalents, greater than or equal to about 0.7 equivalents, greater than or equal to about 0.8 equivalents, or greater than or equal to about 0.9 equivalents, based on 1 equivalent of the epoxy compound, and less than or equal to about 1.7 equivalents, less than or equal to about 1.6 equivalents, less than or equal to about 1.5 equivalents, less than or equal to about 1.4 equivalents, less than or equal to about 1.3 equivalents, or less than or equal to about 1.2 equivalents, based on 1 equivalent of the epoxy compound. Within the above equivalence or concentration range, the curing rate may be increased, and an amount of the unreacted curing agent may be minimized to prevent deterioration of insulating properties of the molding material.

The composition may further include, in addition to the aforementioned epoxy compound, other types of epoxy resins, i.e., epoxy resins containing or based on other groups, such as a bisphenol epoxy resin or a derivative thereof such as a bisphenol A epoxy resin, a bisphenol F epoxy resin, a bisphenol S epoxy resin, a bisphenol E epoxy resin, a bisphenol M epoxy resin, a bisphenol P epoxy resin, or a bisphenol Z epoxy resin; a novolac epoxy resin such as a phenol novolac epoxy resin or a cresol novolac epoxy resin; an aryl alkylene epoxy resin such as a biphenyl epoxy resin or a biphenyl aralkyl epoxy resin; an epoxy resin such as a naphthalene-epoxy resin, an anthracene epoxy resin, a phenoxy epoxy resin, a dicyclopentadiene epoxy resin, a norbornene epoxy resin, an adamantane epoxy resin, or a fluorene epoxy resin.

The composition may further include a filler. Herein, the filler may include an inorganic filler, an organic filler, or a combination thereof.

The inorganic filler may include silicon oxide, calcium carbonate, magnesium carbonate, alumina, magnesia, clay, alumina ($Al_2O_3$), titania ($TiO_2$), talc, calcium silicate, antimony oxide, glass fiber, or eucryptite ceramic, but is not limited thereto. The eucryptite ceramic is a crystallized glass composed of $Li_2O$, $Al_2O_3$ and $SiO_2$ components.

The organic filler may include at least one of polyethyleneimine, ethylene glycol, or polyethylene glycol, but is not limited thereto.

According to an embodiment, based on 100 parts by weight of the epoxy compound in the composition, the filler may be used in an amount of greater than or equal to about 40 parts by weight, greater than or equal to about 41 parts by weight, greater than or equal to about 42 parts by weight, greater than or equal to about 43 parts by weight, greater than or equal to about 44 parts by weight, or greater than or equal to about 45 parts by weight, and less than or equal to about 99 parts by weight, less than or equal to about 98 parts by weight, less than or equal to about 97 parts by weight, less than or equal to about 96 parts by weight, or less than or equal to about 95 parts by weight. Within the above part by weight ranges, desired physical properties such as formability, low stress, high-temperature strength, rigidity, and coefficient of thermal expansion may be appropriately adjusted.

The composition may further include at least one additive selected from a curing accelerator, a reaction modifier, a release agent, a coupling agent, a stress reliever, and an auxiliary flame retardant, if necessary.

In an embodiment, the method for preparing the composition is not particularly limited, but the composition may be prepared by uniformly mixing each of components required for the composition using a Henschel mixer or a Redige mixer, then melt-kneading the mixture at about 90° C. to about 200° C. with a roll mill or a kneader, and performing cooling and pulverization processes.

A semiconductor package may be provided by forming a molding portion using the aforementioned composition.

A semiconductor package may be provided on a printed circuit board on which the semiconductor chip is mounted by sealing the semiconductor chip with a molding portion in order to protect the semiconductor chip from the external environment. The resulting semiconductor package have insulating properties, and effectively dissipate heat during operation of the chip. In this case, the molding portion may be formed by coating the composition according to the embodiment as a molding composition for a semiconductor package.

In addition, the semiconductor packages may be vertically connected to each other through solder bumps electrically connecting the semiconductor packages formed using the composition to form a package-on-package type semiconductor package.

FIG. 1 is a cross-sectional schematic representation of a semiconductor package 100 according to an embodiment.

Referring to FIG. 1, the semiconductor package 100 includes a substrate 105; a die attach film 104 on the substrate 105; a chip 103 disposed on the substrate 105 and attached to the substrate 105 through the die attach film 104; a connection portion 106 such as a bonding wire for electrically connecting the chip 103 and the substrate 105 to each other; and a molding portion 110 configured to encapsulate the chip 103 and the connection portion 106 and to protect the substrate 105 and a mounting structure including the chip 103 and the connection portion 106 mounted on the substrate 105.

The molding portion 110 may be formed on the substrate 105 to completely cover the chip 103 and the connection portion 106.

The molding portion 110 is obtained from the composition (molding composition for a semiconductor package) according to an aforementioned embodiment. The molding portion 110 may include a molding resin 101 and filler 102 dispersed in the molding resin 101. The molding portion 110 may have a form in which the filler 102 is dispersed in a matrix formed by curing a liquid crystalline epoxy compound in the presence of the amine-based curing agent.

According to one embodiment, the filler 102 may be omitted.

On a surface 105B of the substrate 105 opposite to the mounting surface 105A of the substrate on which the chip 103 is mounted, a plurality of solder balls 107 is formed to electrically connect the chip 103 with an external circuit (not shown).

When the composition is used to manufacture, for example, the semiconductor package 100 shown in FIG. 1, a low-pressure transfer molding process may be used to form the molding portion 110 sealing the chip 103 mounted on the substrate 105. However, the present embodiment is not limited thereto but may use, for example, an injection molding process or a casting process instead of the low-pressure transfer molding process.

The cured molding composition according to an embodiment may protect a chip region in the semiconductor package from moisture. Accordingly, reliability of the semiconductor package may be improved in a relatively humid environment.

Figure 2:
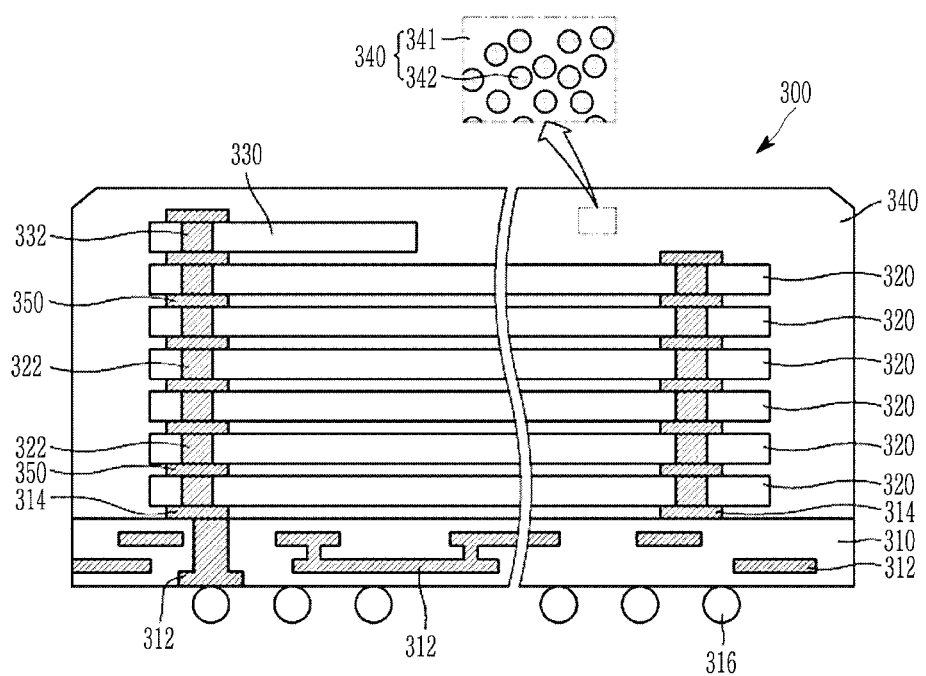
FIG. 2 is a cross-sectional schematic representation of an integrated circuit device according to an embodiment.

FIG. 2 is a cross-sectional schematic representation of an integrated circuit device 300 according to an embodiment.

Referring to FIG. 2, the integrated circuit device 300 includes a plurality of semiconductor chips 320 sequentially stacked on a package substrate 310. A control chip 330 is connected onto the plurality of semiconductor chips 320. A stacking structure of the plurality of semiconductor chips 320 and the control chip 330 on the package substrate 310 is sealed with a molding portion 340. The molding portion 340 may have a similar configuration to the molding portion 110 with reference to FIG. 1. The molding portion 340 may be formed by using the aforementioned composition (molding composition for semiconductor package) according to an embodiment. The molding portion 340 may include a molding resin 341 and a plurality of fillers 342 dispersed in the molding resin 341. The molding resin 341 and filler 342, with reference to FIG. 1, are the same as the molding resin 101 and filler 102.

FIG. 2 illustrates a structure that six semiconductor chips 320 are vertically stacked, but the number and stacking directions of the semiconductor chips 320 are not limited thereto. The number of semiconductor chips 320 may be smaller or larger than 6. The plurality of semiconductor chips 320 may be aligned in a horizontal direction, a vertical direction, in a random direction, or a combination thereof on the package substrate 310. In an embodiment, the control chip 330 may be omitted.

The package substrate 310 may be configured to have a flexible printed circuit (FPC) board, a rigid printed circuit board, or a combination thereof. The package substrate 310 includes an internal wire 312 and a connection terminal 314. The connection terminal 314 may be formed on one surface of the package substrate 310. On the other surface of the package substrate 310, a solder ball 316 is formed. The connection terminal 314 is electrically connected to the solder ball 316 through the internal wire 312.

In an embodiment, the solder ball 316 may be replaced with a conductive bump or LGA (lead grid array).

The plurality of semiconductor chips 320 and the control chip 330 respectively include a connection structure 322 and 332, respectively. In an embodiment, the connection structure 322 and 332 may be a TSV (through silicon via) contact structure.

Each connection structure 322 and 332 of the plurality of semiconductor chips 320 and the control chip 330 may be electrically connected to the connection terminal 314 of the package substrate 310 through a connection portion 350.

The plurality of semiconductor chips 320 respectively may include a system LSI, a flash memory, DRAM, SRAM, EEPROM, PRAM, MRAM, or RRAM. The control chip 330 may include a logic circuit such as a SER/DES (serializer/deserializer) circuit.

Figure 3:
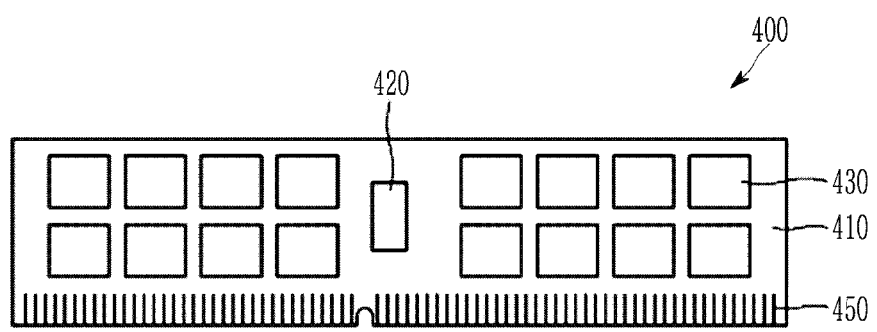
FIG. 3 is a plan view illustrating a schematic representation of an integrated circuit device according to an embodiment.

FIG. 3 is a plan view illustration of an integrated circuit device 400 according to an embodiment.

The integrated circuit device 400 includes a module substrate 410 and a control chip 420 and a plurality of semiconductor packages 430 mounted on the module substrate 410. In the module substrate 410, a plurality of input/output terminals 450 are formed.

The plurality of semiconductor packages 430 includes at least either one of the semiconductor package 100 shown in FIG. 1 and the integrated circuit device 300 shown in FIG. 2.

Figure 4:
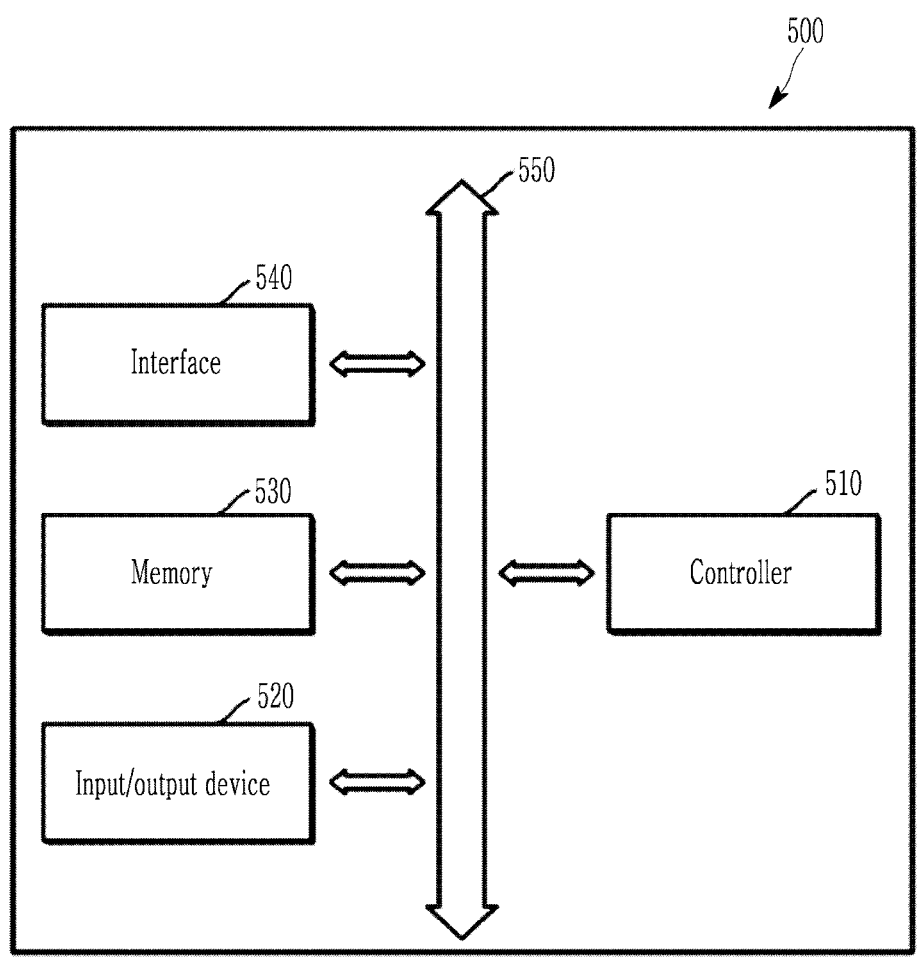
FIG. 4 is a diagram illustrating a schematic representation of an integrated circuit device according to an embodiment.

FIG. 4 is a diagram illustrating a schematic representation of an integrated circuit device 500 according to an embodiment.

The integrated circuit device 500 includes a controller 510, an input/output device 520, a memory 530, and an interface 540. The integrated circuit device 500 may be a mobile system or a system for transmitting or receiving information. In an embodiment, the mobile system is at least one of PDA (personal digital assistant), a portable computer, a web tablet, a wireless phone, a mobile phone, a digital music player, or a memory card.

In an embodiment, the controller 510 is a microprocessor, a digital signal processor, or a micro-controller.

The input/output device 520 is used for data input/output of the integrated circuit device 500. The integrated circuit device 500 may be connected to an external device, for example, a personal computer or a network by using the input/output device 520 and exchange data with the external device. In embodiments, the input/output device 520 is a keypad, a keyboard, or a display device (display).

In embodiments, the memory 530 stores codes and/or data for operating the controller 510. In another embodiment, the memory 530 stores data processed in the controller 510. At least one of the controller 510 and memory 530 includes at least one of the semiconductor package 100 shown in FIG. 1 and the integrated circuit device 300 shown in FIG. 2.

The interface 540 serves as a data transmission path between the integrated circuit device 500 and another external device. The controller 510, the input/output device 520, the memory 530, and the interface 540 may communicate one another through a bus 550.

The integrated circuit device 500 may be included in a mobile phone, an MP3 player, a navigation system, a portable multimedia player (PMP), a solid-phase disk (SSD), or household appliances.

Figure 5:
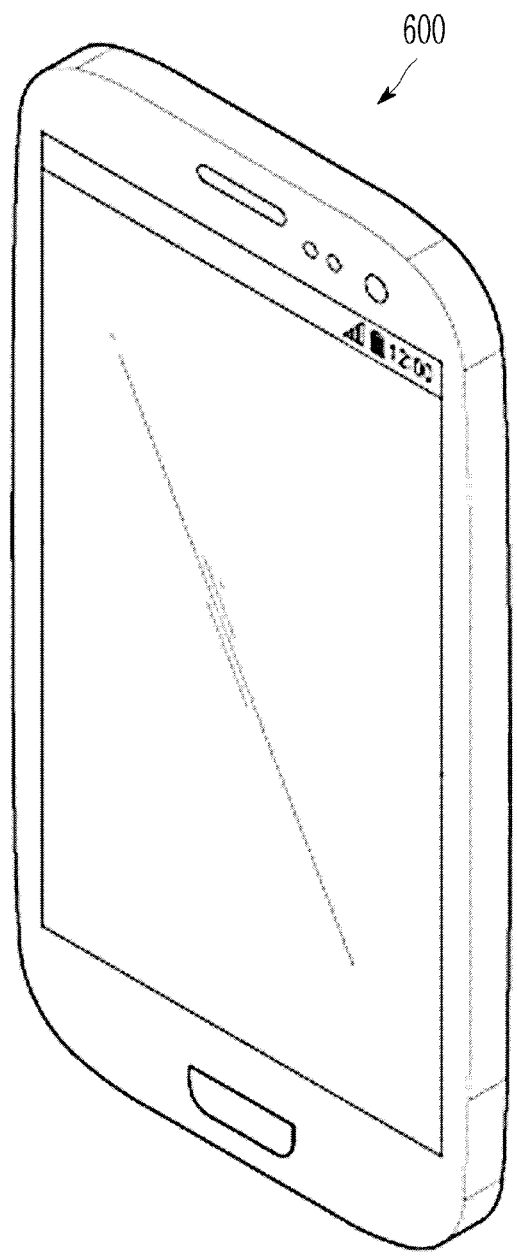
FIG. 5 is a schematic illustration of a mobile wireless phone according to an embodiment.

FIG. 5 is a schematic illustration of a mobile wireless phone 600 according to an embodiment The mobile wireless phone 600 includes at least one of the semiconductor package 100 shown in FIG. 1, the integrated circuit device 300 shown in FIG. 2, the integrated circuit device 400 shown in FIG. 3, or the integrated circuit elements 500 shown in FIG. 4.

Hereinafter, the embodiments are illustrated in more detail with reference to examples. However, these examples are exemplary, and the present scope is not limited thereto.

Synthesis of Amine-Based Curing Agent

Synthesis Example 1-1: Synthesis of Amine-Based Curing Agent Represented by Chemical Formula 1-1

Chemical Formula 1-1

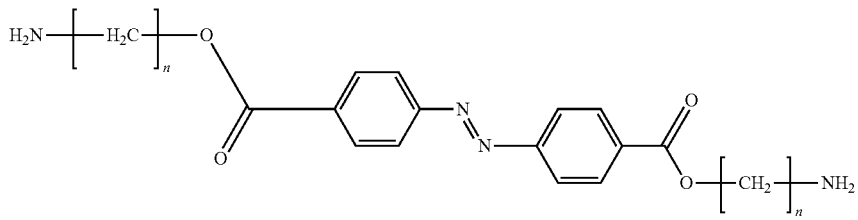

In Chemical Formula 1-1, n is 2.

4,4'-[(Z)-1,2-diiazenediyl]dibenzoic acid (0.5 mol, 135 g), ethanolamine (1 mol, 61 g), diisopropyl carbodiimide (DIC, 1 mol, 126 g), and dimethyl formamide (DMF, 250 ml) are added to a 1000 ml glass reactor. After sufficiently filling the reactor with nitrogen gas, and under a flow of nitrogen gas, the mixture is refluxed for 1 hour. The reaction is allowed to warm to room temperature and the reaction product is washed with cool water and ethanol, to provide a compound of Chemical Formula 1-1. The reaction product is confirmed with $^1$H-NMR.

$^1$H-NMR (DMSO-d6, δ ppm): 1.7 4H, 3.36 4H, 4.68 4H, 8.02 4H, 8.22 4H

Synthesis Example 1-2: Synthesis of Amine-Based Curing Agent Represented by Chemical Formula 1-2

Chemical Formula 1-2

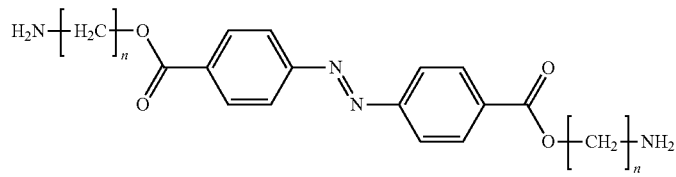

In Chemical Formula 1-2, n is 12.

To a 1000 ml glass reactor, 4,4'-[(Z)-1,2-diazendiyl]dibenzoic acid (0.5 mol, 135 g), 12-amino-1-dodecanol (1 mol, 201 g), DIC (diisopropyl carbodiimide, 1 mol, 126 g), and DMF (250 ml) are added. After sufficiently filling the reactor with nitrogen gas, the mixture is refluxed under nitrogen for 1 hour. The reaction product mixture is allowed to warm to room temperature and the reaction product is washed with cool water and to provide a compound of Chemical Formula 1-2. The reaction product is confirmed $^1$H-NMR.

$^1$H-NMR (DMSO-d6, δ ppm): 1.26 14H, 1.43 4H, 1.5 4H, 1.52 4H, 1.78 4H, 2.69 4H, 4.33 4H, 8.02 4H, 8.22 4H

Synthesis Example 1-3: Synthesis of Amine-Based Curing Agent Represented by Chemical Formula 1-3

Chemical Formula 1-3

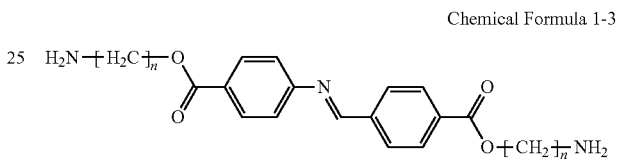

In Chemical Formula 1-3, n is 2.

To a 1000 ml glass reactor, 4-carboxybenzaldehyde (1 mol, 150 g), 4-aminobenzoic acid (1 mol, 137 g), DIC (diisopropyl carbodiimide, 1 mol, 126 g), and DMF (250 ml) are added. After sufficiently filling the reactor with nitrogen gas, and under a flow of nitrogen gas the mixture is refluxed under nitrogen for 1 hour. The reaction product is allowed to warm to room temperature and the reaction product is washed with cool water and ethanol, to provide 4-[(E)-(4-carboxybenzylidene)amino]benzoic acid, Intermediate 1-3a.

To a 1000 ml glass reactor, Intermediate 1-3a (0.5 mol, 134 g) and ethanolamine (1 mol, 61 g), DIC (diisopropyl carbodiimide, 1 mol, 126 g), and DMF (250 ml) are added. Under a nitrogen atmosphere, and the reaction mixture is refluxed for 1 hour to provide a compound of Chemical Formula 1-3. The reaction product is confirmed with $^1$H-NMR.

$^1$H-NMR (DMSO-d6, δ ppm): 1.7 4H, 3.36 4H, 4.68 4H, 7.33 2H, 7.86 2H, 8.02 2H, 8.19 2H, 8.67 1H

Synthesis Example 1-4: Synthesis of Amine-Based Curing Agent Represented by Chemical Formula 1-4

Chemical Formula 1-4

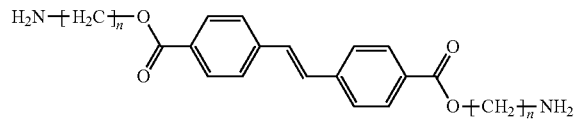

In Chemical Formula 1-4, n is 2.

To a 1000 ml glass reactor, 4,4'-(1,2-ethenediyl)bisbenzoic acid (0.5 mol, 134 g), ethanolamine (1 mol, 61 g), DIC (diisopropyl carbodiimide, 1 mol, 126 g), and DMF (250 ml) are added. After filling the reactor with nitrogen gas, and under a flow of nitrogen gas the mixture is refluxed for 1 hour. The reaction is allowed to warm to room temperature and the reaction product is washed with cool water and ethanol to provide a compound of Chemical Formula 1-4. The reaction product is confirmed with $^1$H-NMR.

$^1$H-NMR (DMSO-d6, δ ppm): 1.7 4H, 3.36 4H, 4.68 4H, 6.9 2H, 7.57 4H, 7.72 4H

Synthesis of Epoxy Compounds

Synthesis Example 2-1: Synthesis of Epoxy Compound Represented by Chemical Formula 2-1

Chemical Formula 2-1

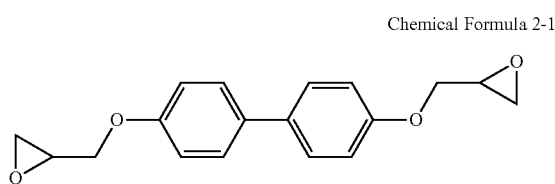 [SMILES: c1cc(-c2ccc(OCC3CO3)cc2)ccc1OCC1CO1]

To a 500 ml reactor, 4,4'-bisphenol (0.5 mol, 93 g), epichlorohydrin (1 mol, 92 g), methylethylketone (MEK, 100 ml), and tetrabutyl ammonium bromide (TBAB, 0.135 g, 0.4 mmol) are added. After filling the reactor with nitrogen gas, the temperature of the reactor is increased to 120° C. under a flow of nitrogen gas, and the mixture is refluxed for 1 hour. The product mixture is separated from the solvent and purified, obtaining an epoxy compound of Chemical Formula 2-1. The reaction product is confirmed with $^1$H-NMR with respect to synthesis.

$^1$H-NMR (DMSO-d6, δ ppm): 2.6 4H, 3.13 2H, 4.49 4H, 7.75 4H, 8.02 4H

Synthesis Example 2-2

A compound represented by Chemical Formula 2-2 (NC-3000, Nippon Kayaku Co. Ltd.) is used.

Chemical Formula 2-2

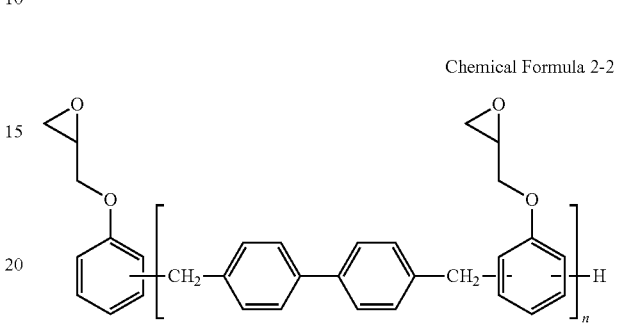

Synthesis Example 2-3: Synthesis of Epoxy Compound Represented by Chemical Formula 2-3

Chemical Formula 2-3

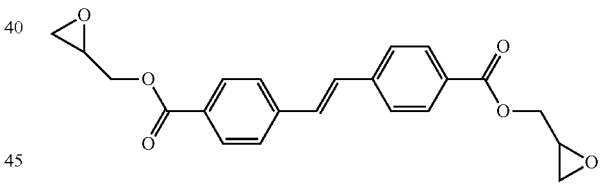

To a 500 ml reactor, 4,4'-(1,2-ethenediyl)bisbenzoic acid (0.5 mol, 134 g), epichlorohydrin (1 mol, 92 g), methylethylketone (MEK, 100 ml), and tetrabutyl ammonium bromide (TBAB, 0.135 g, 0.4 mmol) are added. After sufficiently filling the reactor with nitrogen gas, the temperature inside the reactor is increased to 120° C. under a flow of nitrogen gas, and the mixture is refluxed for 1 hour. The product mixture is separated from the solvent and purified providing an epoxy compound of Chemical Formula 2-3. The reaction product is confirmed with $^1$H-NMR.

$^1$H-NMR (DMSO-d6, δ ppm): 2.6 4H, 3.13 2H, 4.49 4H, 6.9 2H, 7.57 4H, 7.72 4H

Synthesis Example 2-4: Synthesis of Epoxy Compound Represented by Chemical Formula 2-4

Chemical Formula 2-4

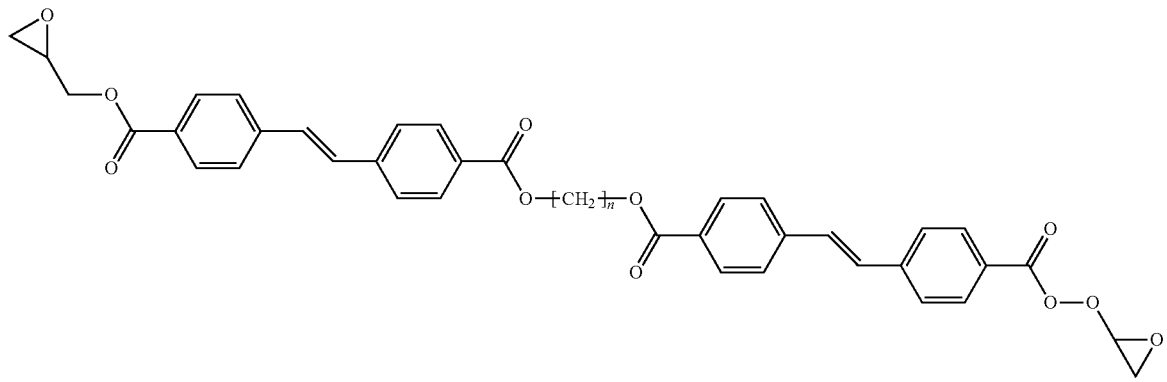

In Chemical Formula 2-4, n is 2.

To a 1000 ml reactor, 4,4'-(1,2-ethenediyl)bisbenzoic acid (1 mol, 268 g), ethylene glycol (0.5 mol, 31 g), DIC (diisopropyl carbodiimide, 1 mol, 126 g), and DMF (250 ml) are added. After sufficiently filling the reactor with nitrogen gas, and under a flow of nitrogen gas the mixture is refluxed for 1 hour. A reaction product is washed with cool water and ethanol to provide Intermediate 2-4a.

To a 1000 ml reactor, Intermediate 2-4a (0.5 mol, 281 g), epichlorohydrin (1 mol, 92 g), methylethylketone (MEK, 100 ml), and tetrabutyl ammonium bromide (TBAB, 0.135 g, 0.4 mmol) are added. After sufficiently filling the reactor with nitrogen gas, the temperature inside the reactor is increased to 120° C. under a flow of nitrogen gas, and the mixture is refluxed for 1 hour. The product mixture is separated and purified obtaining an epoxy compound of Chemical Formula 2-4. The reaction product is confirmed with $^1$H-NMR with respect to synthesis.

$^1$H-NMR (DMSO-d6, δ-ppm): 2.6 4H, 3.13 2H, 4.49 4H, 4.66 4H, 6.9 4H, 7.57 8H, 7.72 8H Comparative Synthesis Example 1-1

A compound represented by Chemical Formula 1-1C (MEH-7500-3S, Meiwa Corporation) is used as a curing agent.

Chemical Formula 1-1C

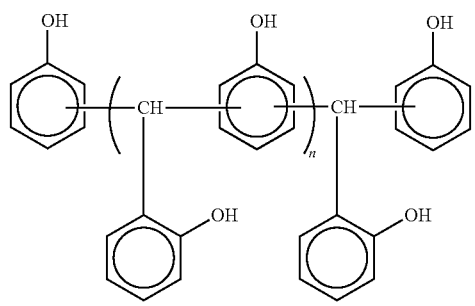

Comparative Synthesis Example 1-2

A compound represented by Chemical Formula 1-2C (4,4'-diaminodiphenylmethane, TCI) is used as a curing agent.

Chemical Formula 1-2C

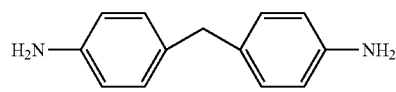

Examples 1 to 6 and Comparative Examples 1 to 4

Compositions and Composite Specimens for Semiconductor Package

As described in Table 1, a curing agent and epoxy compound are mixed in a ratio of 1:1 to prepare a composition for semiconductor package, and 5 g of the composition is poured into an aluminum mold and cured by heating to a temperature of 190° C. to obtain a cured composite specimen.

Thermal Conductivity Evaluation

The composite specimens according to Examples 1 to 6 and Comparative Examples 1 to 4 are evaluated with respect to thermal conductivity, and the results are listed in Table 1.

The thermal conductivity is evaluated by using C-THERM TCI™ thermal conductivity meter in an MTPS (Modified Transient Plane Source) method.

TABLE 1

| | Curing agent | Epoxy compound | Thermal conductivity (W/mK) |
|---|---|---|---|
| Example 1 | Synthesis Ex. 1-1 | Synthesis Ex. 2-1 | 0.40 |
| Example 2 | Synthesis Ex. 1-2 | Synthesis Ex. 2-1 | 0.41 |
| Example 3 | Synthesis Ex. 1-3 | Synthesis Ex. 2-1 | 0.40 |
| Example 4 | Synthesis Ex. 1-4 | Synthesis Ex. 2-1 | 0.42 |
| Example 5 | Synthesis Ex. 1-1 | Synthesis Ex. 2-4 | 0.45 |
| Example 6 | Synthesis Ex. 1-4 | Synthesis Ex. 2-4 | 0.46 |
| Comparative Example 1 | Comparative Synthesis Ex. 1-1 | Synthesis Ex. 2-1 | 0.29 |
| Comparative Example 2 | Comparative Synthesis Ex. 1-2 | Synthesis Ex. 2-1 | 0.31 |
| Comparative Example 3 | Comparative Synthesis Ex. 1-1 | Synthesis Ex. 2-2 | 0.18 |
| Comparative Example 4 | Comparative Synthesis Ex. 1-2 | Synthesis Ex. 2-3 | 0.32 |

As shown in Table 1, the compositions for making a semiconductor package (cured composition) using an amine-based curing agent having the structure of Chemical Formula 1 according to Examples 1 to 6 exhibit excellent thermal conductivity, compared with Comparative Examples 1 to 4. In particular, the compositions for making the semiconductor packages using an amine-based curing agent having the structure of Chemical Formula 1 according to Examples 5 to 6 exhibit much improved thermal conductivity.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

| Description of symbols | |
|---|---|
| 100: semiconductor package | 101,341: molding resin |
| 102, 342: filler | 110, 340: molding portion |
| 103: chip | 104: die attach film |
| 105: substrate | 106, 350: connection portion |
| 310: package substrate | 314: connection terminal |
| 107, 316: solder ball | 110, 340: molding portion |
| 300: integrated circuit device | 400, 500: integrated circuit device |
| 600: mobile wireless phone | |

What is claimed is:

1. An amine-based curing agent, comprising a compound represented by Chemical Formula 1:

Chemical Formula 1

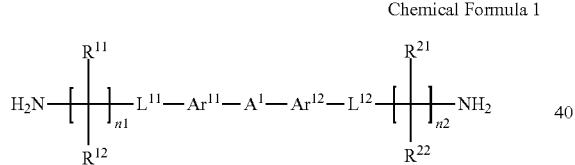

wherein, in Chemical Formula 1, $R^{11}$, $R^{12}$, $R^{21}$, and $R^{22}$ are each independently hydrogen, a halogen, a C1 to C20 alkyl group, a C1 to C20 heteroalkyl group, a C1 to C20 haloalkyl group, a C1 to C20 alkoxy group, or a C6 to C10 aryl group, $A^1$ is —CR$^a$=CR$^b$—, —N=CR$^c$—, —N=N—, or —CR$^d$=N—, wherein $R^a$, $R^b$, $R^c$, and $R^d$ are each independently hydrogen, a C1 to C10 alkyl group, or a C1 to C10 haloalkyl group, $L^{11}$ and $L^{12}$ are each independently —C(=O)O—, —OC(=O)—, —O—C(=O)O—, —C(=O)—, —CR$^e$=CR$^f$—C(=O)—, —S(=O)—, —CR$^g$=N—, —NR$^h$C(=O)O—, —C(=O)NR$^i$—, or —OC(=O)NHS(=O)O—, wherein $R^e$, $R^f$, $R^g$, $R^h$, and $R^i$ are each independently hydrogen, a C1 to C10 alkyl group, or a C1 to C10 haloalkyl group, $Ar^{11}$ and $Ar^{12}$ are each independently a substituted or unsubstituted C6 to C30 arylene group, C2 to C30 heteroarylene group, or a combination thereof, and n1 and n2 are each independently an integer of greater than or equal to 2.

2. The amine-based curing agent of claim 1, wherein in Chemical Formula 1, $Ar^{11}$ and $Ar^{12}$ are each independently represented by Chemical Formulas 1A to 1I:

Chemical Formulas 1A to 1I

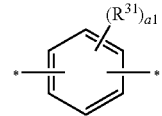 (1A)

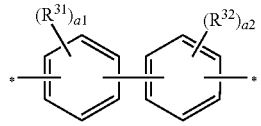 (1B)

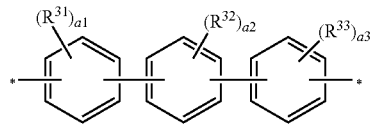 (1C)

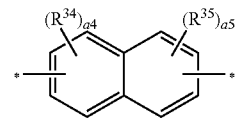 (1D)

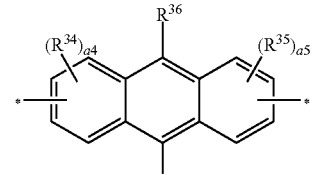 (1E)

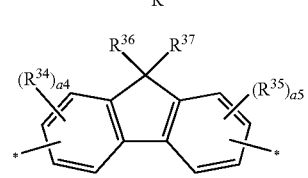 (1F)

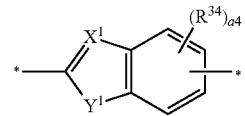 (1G)

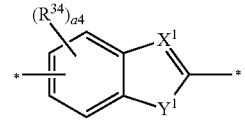 (1H)

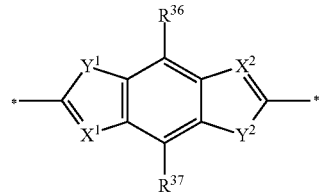 (1I)

wherein, in Chemical Formulas 1A to 1I, $R^{31}$, $R^{32}$, $R^{33}$, $R^{34}$, $R^{35}$, $R^{36}$, and $R^{37}$ are each independently hydrogen or a C1 to C10 alkyl group, $X^1$ and $X^2$ are each independently $CR^x$, N, P, or As, wherein $R^x$ is hydrogen, a C1 to C10 alkyl group, or a C1 to C10 haloalkyl group, $Y^1$ and $Y^2$ are each independently O, S, Se, or Te, a1, a2 and a3 are each independently an integer of 0 to 4, a4 and a5 are each independently an integer of 0 to 3, and

* is a linking point.

3. The amine-based curing agent of claim 1, wherein in Chemical Formula 1, $Ar^{11}$ and $Ar^{12}$ are the same or different aromatic moieties.

4. The amine-based curing agent of claim 1, wherein in Chemical Formula 1, an $L^{11}$-$Ar^{11}$ bond and an $Ar^{11}$-$A^1$ bond are in a meta position or a para position to each other, and independently, an $L^{12}$-$Ar^{12}$ bond and an $Ar^{12}$-$A^1$ bond are in a meta position or a para position to each other.

5. The amine-based curing agent of claim 1, wherein the compound represented by Chemical Formula 1 comprises a compound represented by Chemical Formula 2:

Chemical Formula 2

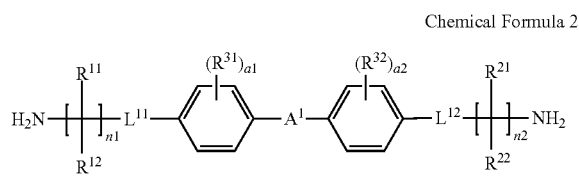

wherein, in Chemical Formula 2, $R^{11}$, $R^{12}$, $R^{21}$, $R^{22}$, $A^1$, $L^{11}$, $L^{12}$, n1, and n2 are the same as in Chemical Formula 1, $R^{31}$ and $R^{32}$ are each independently hydrogen, a C1 to C10 alkyl group, a C1 to C10 haloalkyl group, or a C6 to C10 aryl group, and a1 and a2 are each independently an integer of 0 to 4.

6. The amine-based curing agent of claim 1, wherein the compound represented by Chemical Formula 1 comprises a compound represented by Chemical Formula 3:

Chemical Formula 3

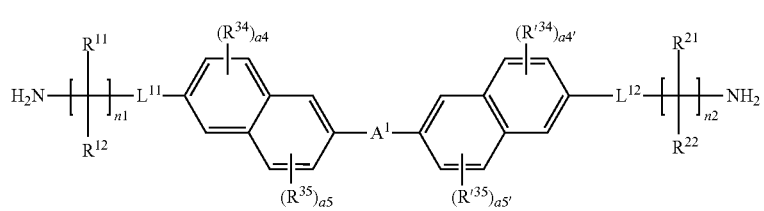

wherein, in Chemical Formula 3, $R^{11}$, $R^{12}$, $R^{21}$, $R^{22}$, $A^1$, $L^{11}$, $L^{12}$, n1 and n2 are the same as in Chemical Formula 1, $R^{34}$, $R^{35}$, $R'^{34}$, and $R'^{35}$ are each independently hydrogen, a C1 to C10 alkyl group, a C1 to C10 haloalkyl group, or a C6 to C10 aryl group, and a4, a5, a4' and a5' are each independently an integer of 0 to 3.

7. The amine-based curing agent of claim 1, wherein in Chemical Formula 1, n is in the range of 2 to 12.

8. A composition comprising the amine-based curing agent of claim 1 and an epoxy compound.

9. The composition of claim 8, wherein the epoxy compound is a compound represented by Chemical Formula 4:

Chemical Formula 4

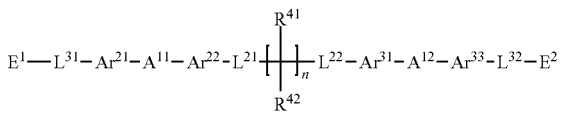

wherein, in Chemical Formula 4, $R^{41}$ and $R^{42}$ are each independently hydrogen, a halogen, a C1 to C20 alkyl group, a C1 to C20 heteroalkyl group, a C1 to C20 haloalkyl group, a C1 to C20 alkoxy group, or a C6 to C10 aryl group, $A^{11}$ and $A^{12}$ are —$CR^a$=$CR^b$—, —N=$CR^c$—, —N=N—, or —$CR^d$=N—, wherein $R^a$, $R^b$, $R^c$ and $R^d$ are each independently hydrogen, a C1 to C10 alkyl group, or a C1 to C10 haloalkyl group, $L^{21}$, $L^{22}$, $L^{31}$, and $L^{32}$ are each independently —C(=O)O—, —OC(=O)—, —O—C(=O)O—, —C(=O)—, —$CR^e$=$CR^f$—C(=O)—, —S(=O)—, —$CR^g$=N—, —$NR^h$C(=O)O—, —C(=O)$NR^{hi}$—, or —OC(=O)NHS(=O)O—, wherein $R^e$, $R^f$, $R^g$, $R^h$, and $R^i$ are each independently hydrogen, a C1 to C10 alkyl group, or a C1 to C10 haloalkyl group, $Ar^{21}$, $Ar^{22}$, $Ar^{31}$, and $Ar^{32}$ are each independently a substituted or unsubstituted C6 to C30 arylene group, a substituted or unsubstituted $C_2$ to C30 heteroarylene group, or a combination thereof, $E^1$ and $E^2$ are each independently an epoxy-containing group, and n is each independently an integer of greater than or equal to 2.

10. The composition of claim 9, wherein in Chemical Formula 4, $Ar^{21}$, $Ar^{22}$, $Ar^{31}$ and $Ar^{32}$ are each independently represented by Chemical Formulas 1A to 1I:

Chemical Formulas 1A to 1I (1A)

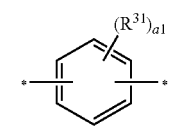

(1B)

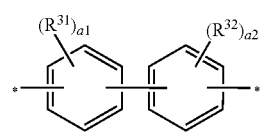

-continued

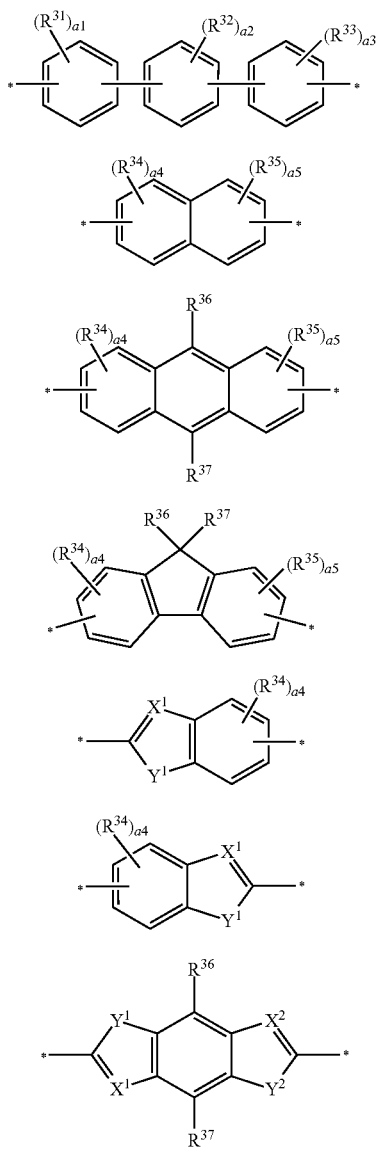

wherein, in Chemical Formulas 1A to 1I,
$R^{31}$, $R^{32}$, $R^{33}$, $R^{34}$, $R^{35}$, $R^{36}$, and $R^{37}$ are each independently hydrogen or a C1 to C10 alkyl group,
$X^1$ and $X^2$ are each independently $CR^x$, N, P, or As, wherein $R^x$ is hydrogen, a C1 to C10 alkyl group, or a C1 to C10 haloalkyl group,
$Y^1$ and $Y^2$ are each independently O, S, Se, or Te,
a1, a2 and a3 are each independently an integer of 0 to 4,
a4 and a5 are each independently an integer of 0 to 3, and
* is a linking point.

11. The composition of claim 9, wherein
in Chemical Formula 4, an $L^{31}$-$Ar^{21}$ bond and an $Ar^{21}$-$A^{11}$ bond; an $A^{11}$-$Ar^{22}$ bond and an $Ar^{22}$-$L^{21}$ bond; an $L^{22}$-$Ar^{31}$ bond and an $Ar^{31}$-$A^{12}$ bond; and an $A^{12}$-$Ar^{33}$ bond and an $Ar^{33}$-$L^{32}$ bond; are each independently in a meta position or a para position to each other.

12. The composition of claim 9, wherein
in Chemical Formula 4, $Ar^{21}$ and $Ar^{22}$ and $Ar^{31}$ and $Ar^{32}$ are the same or different aromatic moieties.

13. The composition of claim 9, wherein
in Chemical Formula 4, $Ar^{21}$, $Ar^{22}$, $Ar^{31}$, and $Ar^{32}$ are a substituted or an unsubstituted phenylene.

14. The composition of claim 9, wherein
in Chemical Formula 4, $Ar^{21}$, $Ar^{22}$, $Ar^{31}$, and $Ar^{32}$ are a substituted or an unsubstituted naphthalene.

15. The composition of claim 9, wherein
in Chemical Formula 4, $Ar^{21}$ and $Ar^{22}$ are a substituted or an unsubstituted phenylene, $Ar^{31}$ and $Ar^{32}$ are a substituted or an unsubstituted naphthalene, $Ar^{21}$ and $Ar^{22}$ are a substituted or an unsubstituted naphthalene, and $Ar^{31}$ and $Ar^{32}$ are a substituted or an unsubstituted phenylene.

16. The composition of claim 9, wherein
the epoxy-containing groups, $E^1$ and $E^2$, of Chemical Formula 4 are each independently represented by Chemical Formula 6:

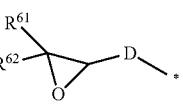

Chemical Formula 6 wherein, in Chemical Formula 6,
D is —O—, —$(CR^pR^q)_m$—, —$(CH(R^p)CH(R^q)O)_l$—, or a combination thereof,
$R^{61}$ and $R^{62}$ are each independently hydrogen, a halogen, a C1 to C10 alkyl group, or a C1 to C10 haloalkyl group,
each $R^p$ and $R^q$ are each independently hydrogen, a halogen, a C1 to C10 alkyl group, or a C1 to C10 haloalkyl group,
m is an integer from 1 to 10, and
l is an integer from 1 to 10.

17. The composition of claim 9, wherein
D of Chemical Formula 6 is —O—.

18. The composition of claim 9, wherein
the epoxy-containing groups, $E^1$ and $E^2$, of Chemical Formula 4 are each independently represented by Chemical Formulas 6A to 6H:

Chemical Formula 6A to 6H

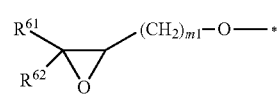

(6A)

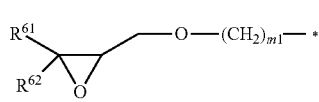

(6B)

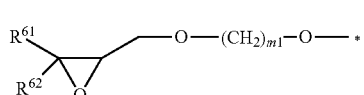

(6C)

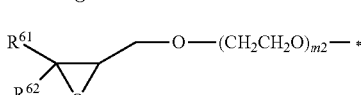

(6D)

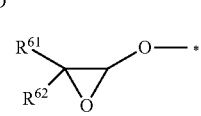

(6E)

-continued

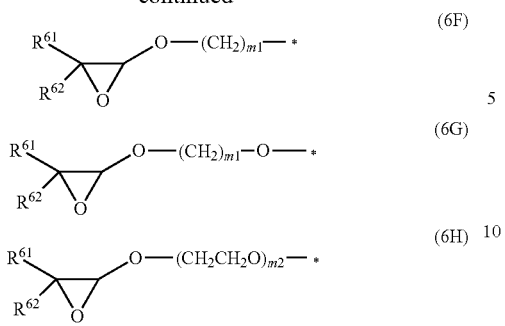

wherein, in Chemical Formulas 6A to 6H, $R^{61}$ and $R^{62}$ are each independently hydrogen, a halogen, a C1 to C10 alkyl group, or a C1 to C10 haloalkyl group, $R^p$ and $R^q$ are each independently hydrogen, a halogen, a C1 to C10 alkyl group, or a C1 to C10 haloalkyl group, and m1 and m2 are each independently an integer of 1 to 10.

19. The composition of claim 8, wherein
the composition further comprises a bisphenol epoxy resin, a novolac epoxy resin, a biphenyl epoxy resin, an aryl alkylene epoxy resin, a naphthalene epoxy resin, an anthracene epoxy resin, a phenoxy epoxy resin, a dicyclopentadiene epoxy resin, a norbornene-epoxy resin, an adamantane epoxy resin, a fluorene epoxy resin, or a combination thereof.

20. The composition of claim 8, wherein
the composition further comprises a filler.

21. A semiconductor package comprising a cured product produced from the composition of claim 8.

22. The semiconductor package of claim 21, wherein
the semiconductor package comprises
a substrate,
at least one chip mounted on the substrate,
a connection portion for electrically connecting the at least one chip and the substrate, and
a molding portion encapsulating the at least one chip on the substrate,
wherein the molding portion comprises a cured product produced from the composition of claim 8.

23. An electronic device comprising a cured product produced from the composition of claim 8.

* * * * *